(12) United States Patent
Blum

(10) Patent No.: US 7,817,750 B2
(45) Date of Patent: Oct. 19, 2010

(54) RADIO RECEIVER INCLUDING A DELAY-LOCKED LOOP (DLL) FOR PHASE ADJUSTMENT

(75) Inventor: Gregory Blum, Lagrangeville, NY (US)

(73) Assignee: Seiko Epson Corporation, Tokyo (JP)

( * ) Notice: Subject to any disclaimer, the term of this patent is extended or adjusted under 35 U.S.C. 154(b) by 736 days.

(21) Appl. No.: 11/751,481

(22) Filed: May 21, 2007

(65) Prior Publication Data

US 2008/0292022 A1 Nov. 27, 2008

(51) Int. Cl.
*H03D 3/18* (2006.01)
(52) U.S. Cl. ...................................... 375/327
(58) Field of Classification Search .................. 375/324, 375/326, 327; 329/302, 307, 325, 346; 455/208
See application file for complete search history.

(56) References Cited

U.S. PATENT DOCUMENTS

| | | | |
|---|---|---|---|
| 4,903,279 A | 2/1990 | Murakami et al. | |
| 5,062,122 A | 10/1991 | Pham et al. | |
| 5,614,855 A | 3/1997 | Lee et al. | |
| 6,272,189 B1 | 8/2001 | Garin et al. | |
| 6,282,234 B1 | 8/2001 | Kameno et al. | |
| 6,463,091 B1 | 10/2002 | Zhodzicshsky et al. | |
| 6,763,057 B1 | 7/2004 | Fullerton et al. | |
| 6,834,087 B2 | 12/2004 | Kenney et al. | |
| 7,015,749 B1 * | 3/2006 | Meacham et al. | 329/303 |
| 7,116,728 B2 * | 10/2006 | McCune, Jr. | 375/324 |
| 7,245,894 B2 * | 7/2007 | Sekiguchi et al. | 455/242.1 |
| 2007/0279110 A1 * | 12/2007 | Hallivuori | 327/156 |

FOREIGN PATENT DOCUMENTS

| | | |
|---|---|---|
| JP | 2003244024 | 8/2003 |
| JP | 2005331369 | 12/2005 |

* cited by examiner

*Primary Examiner*—Don N Vo

(57) ABSTRACT

A method, algorithm, architecture, circuits, and/or systems for using a delay-locked loop (DLL) for phase adjustment in a direct conversion radio receiver are disclosed. In one embodiment, a receiver circuit can include: (i) a voltage-controlled oscillator (VCO) for providing a reference clock; (ii) a delay element that can receive the reference clock and provide a delay adjustment signal; (iii) a first channel for receiving a radio signal and providing a recovered radio signal from the radio signal and the delay adjustment signal, where the first channel includes a first mixer and a first filter; and (iv) a second channel for receiving the radio signal and a phase adjustment signal derived from the delay adjustment signal and for providing a delay control signal to the delay element from the radio signal and the phase adjustment signal, where the second channel includes a second mixer and a second filter.

29 Claims, 7 Drawing Sheets

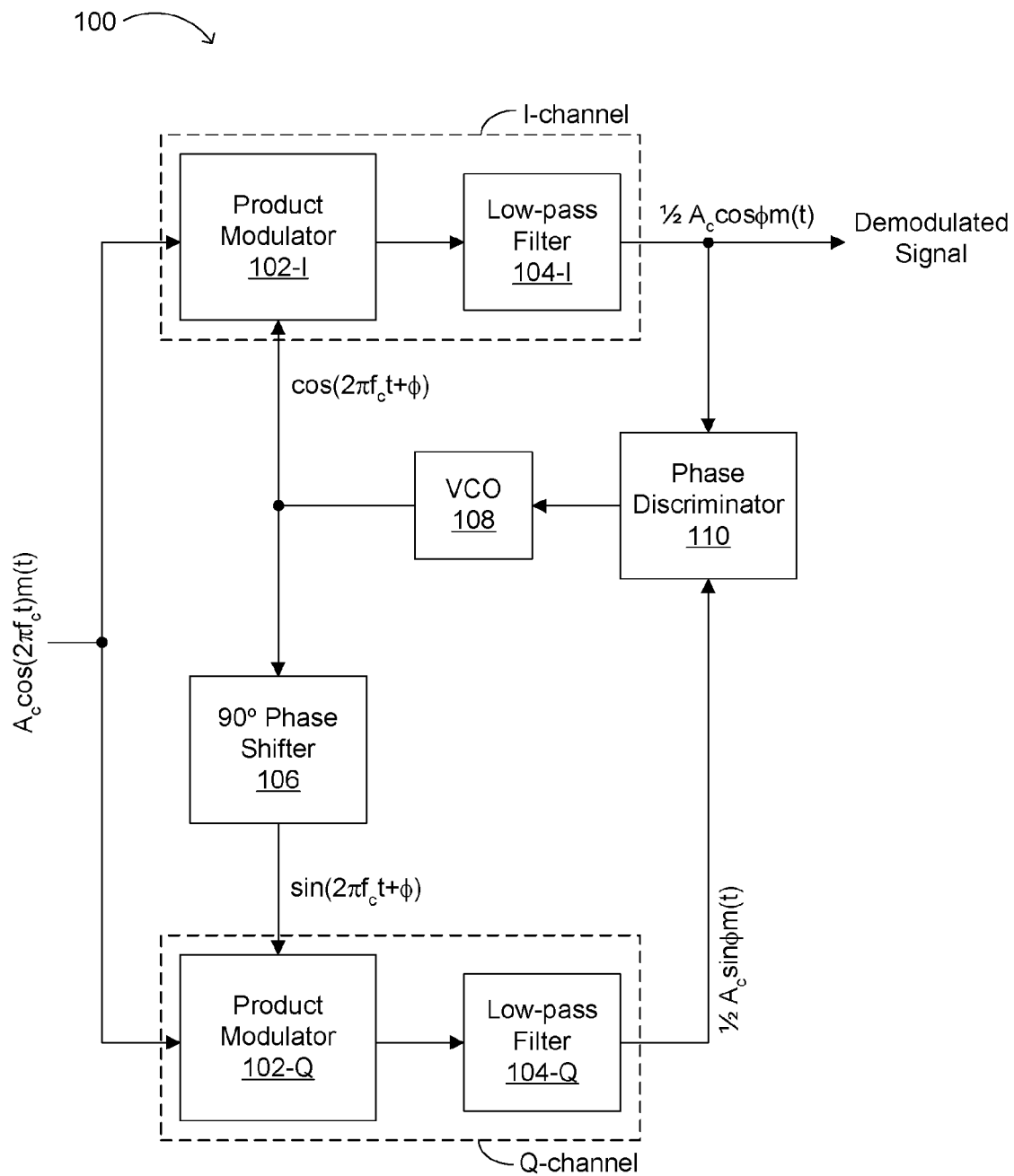
FIG. 1 (conventional)

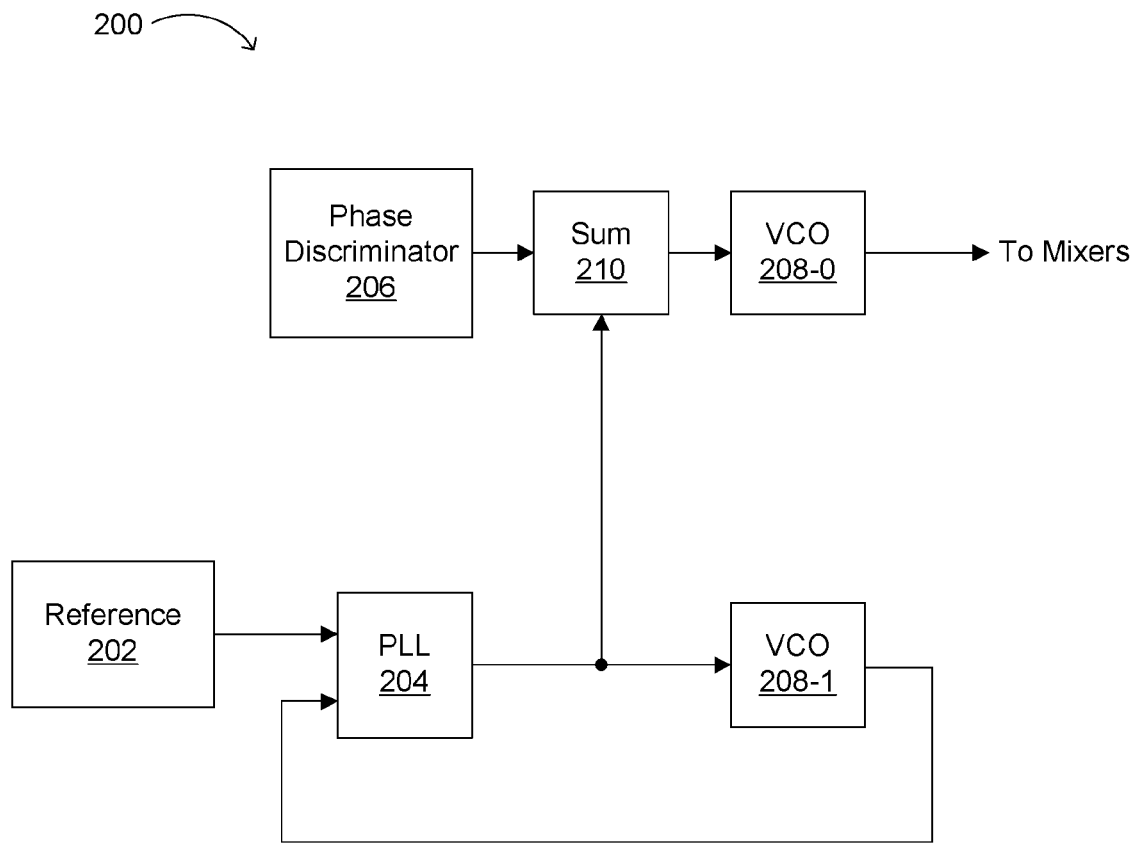
FIG. 2 (conventional)

RADIO RECEIVER INCLUDING A DELAY-LOCKED LOOP (DLL) FOR PHASE ADJUSTMENT

FIELD OF THE INVENTION

The present invention generally relates to the field of receiver circuits and methods. More specifically, embodiments of the present invention pertain to methods, algorithms, architectures, circuits, and/or systems for using a delay-locked loop (DLL) for phase adjustment and/or signal recovery in a direct conversion radio receiver.

DISCUSSION OF THE BACKGROUND

A radio receiver may be used to recover a "baseband" signal (e.g., a radio signal having a first frequency) from transmitted data (e.g., typically having a second frequency different from, and oftentimes higher than, the first frequency). In some cases, the baseband signal may include frequencies near 0 Hz (e.g., 1 Hz). In some wireless communication signal systems, transmitted signals can include original low frequency radio signal portions that are modulated to the higher transmitted carrier frequencies (e.g., in a radio-frequency [RF] signal) for transmission. Such original low frequency components (i.e., the baseband radio signal) can then be converted or recovered from the relatively high frequency components by using a radio receiver.

In a typical conversion to baseband signal frequencies, one or two mixers or multiplier circuits can be used for a "direct down" conversion approach where incoming data (e.g., a radio signal) is directly converted from the transmission frequency or broadcast channel (e.g., typically from about 40 to about 60 kHz) to the baseband frequency (e.g., about 1 Hz) in a receiver. However, one drawback of this approach is a potential mismatch between the transmission frequency and a reference frequency of the receiver. If those frequencies are not identical, a "delta" frequency or frequency difference will be converted into a signal portion or component in a receiver output waveform for the recovered radio signal.

A radio signal may generally be sinusoidal in nature, and may be made up of different components. For example, if a transmitted signal has an AM sinusoidal waveform (e.g., generally having the form $A(t)\cos(\omega_c t)$, where $A(t)$ can be any time-varying signal, cosine may indicate a sinusoidal waveform, $\omega$ may represent an angular frequency, where $\omega = 2\pi f$, and "f" is the frequency of the sinusoidal waveform, and "t" can represent time), and the receiver has a reference oscillator providing a sinusoidal, or ideally, a square wave signal (e.g., generally having the form $B\cos(\omega_1 t + \phi)$ plus its odd harmonics, but simplified to the fundamental frequency discussion herein), a mixer output can be defined as $A(t)B\cos(\omega_c t)\cos(\omega_1 t + \phi)$, which equals $\frac{1}{2}A(t)B[\cos((\omega_1 + \omega_c)t + \phi) + \cos((\omega_1 - \omega_c)t + \phi)]$. Also, when the sum frequency term (e.g., $B\cos((\omega_1 + \omega_c)t + \phi)$) is removed by a low-pass filter, this mixer output can be simplified further, as shown below in Equation 1:

$$\text{Mixer Output} = \tfrac{1}{2}A(t)B\cos((\omega_1 - \omega_c)t + \phi) = \tfrac{1}{2}A(t)B\cos(\Delta\omega t + \phi) \quad (1)$$

As shown, $A(t)$ is the desired recovered signal and the $\cos(\Delta\omega t + \phi)$ portion is a time-varying signal that may be mistaken for a desired signal, depending on the frequency and strength of this signal portion relative to the signal $A(t)$. Another undesirable result, as reflected in Equation 1, involves the phase error, where the mixer output may be zero when the frequencies of the reference and received signals are identical, and the phase difference is 90°, for example. One conventional solution to this problem is to use a Costas receiver, as shown in FIG. 1, and indicated by the general reference character 100. In this approach, an output of voltage-controlled oscillator (VCO) 108 can be applied to mixer or product modulator 102-I, and also can pass via 90° phase shifter 106 to product modulator 102-Q. In the I-channel, an output of product modulator 102-I can connect to low-pass filter 104-I, the output of which can be applied to phase discriminator 110. Similarly, in the Q-channel, an output of product modulator 102-Q can connect to low-pass filter 104-Q, and the output of which can be applied to phase discriminator 110. Further, an output of phase discriminator 110 can be applied to VCO 108 as a control voltage to form a phase-locked loop (PLL).

When feedback in the PLL is correct, it can force $\cos(\phi) = 1$, or $\phi = 0$ degrees. In this type of architecture, the VCO output frequency may need to be relatively close to the carrier frequency for phase lock. Typically, a crystal can be used to provide such an appropriate VCO output frequency. However, crystal oscillators may not be practical at some transmission frequencies. Thus, a second PLL can be employed with a replica VCO, as shown in FIG. 2, and indicated by the general reference character 200. In FIG. 2, reference 202 can provide a reference clock to PLL 204, which can also receive an output from VCO 208-1. An output of PLL 204 can be input to VCO 208-1 and to summation circuit 210, which can also receive an input from phase discriminator 206. An output from summation circuit 210 can be provided to VCO 208-0, an output of which can be sent to mixers (e.g., product modulators 102-I and 102-Q of FIG. 1). Here, a sum of two VCO control voltages can be used to adjust an oscillator (e.g., VCO 208-0) frequency, where the control voltage from PLL 204 can provide a coarse frequency adjustment, and phase discriminator 206 can provide a fine frequency adjustment along with a phase correction.

One drawback of conventional approaches, such as those shown in FIGS. 1 and 2, is the limited synchronization range of the reference clock to the incoming radio signal. Therefore, a reliable approach for synchronization of a reference clock to a radio signal during baseband frequency recovery over a wider range of frequency differentials is desired.

SUMMARY OF THE INVENTION

Embodiments of the present invention relate to methods, algorithms, architectures, circuits, and/or systems for using a delay-locked loop (DLL) for phase adjustment in a direct conversion radio receiver.

In one embodiment, a receiver circuit includes: (i) a voltage-controlled oscillator (VCO) for providing a reference clock; (ii) a delay element configured to receive the reference clock and provide a delay adjustment signal; (iii) a first channel for receiving a radio signal and providing a recovered radio signal from the radio signal and the delay adjustment signal, where the first channel includes a first mixer and a first filter; and (iv) a second channel for receiving the radio signal and a phase adjustment signal derived from the delay adjustment signal and for providing a delay control signal to the delay element from the radio signal and the phase adjustment signal, where the second channel includes a second mixer and a second filter.

In another embodiment, a method of recovering a modulated radio signal includes the steps of: (i) generating a delay adjustment signal by delaying a reference clock by a configurable delay; (ii) phase-shifting the delay adjustment signal to provide a phase adjustment signal; (iii) generating a delay control signal from a received radio signal and the phase adjustment signal; and (iv) recovering a modulated radio signal from the received radio signal and the delay adjustment signal.

In another embodiment, a method of synchronizing a reference clock to a radio signal includes the steps of: (i) receiving the radio signal in first and second channels, the first channel providing a recovered radio signal using a delay adjustment signal, and the second channel providing a delay control signal using a phase adjustment signal derived from the delay adjustment signal; (ii) controlling a delay element using the delay control signal, the delay element receiving a reference clock and providing the delay adjustment signal; and (iii) resetting the delay control signal at a predetermined time. Resetting can occur at a fixed interval, or at a length of time corresponding to the delay adjustment signal having $\cos(0)$ or $\cos(2\pi)$ values, for example.

In another embodiment, a delay reset circuit for a DLL includes: (i) a channel configured to receive a radio signal and provide a delay control signal from the radio signal and a phase adjustment signal, where the channel includes a mixer and a filter, and where the phase adjustment signal is derived from a delay adjustment signal, and the DLL includes a delay element configured to provide the delay adjustment signal from a reference clock; and (ii) a reset circuit configured to reset the delay control signal at a predetermined time.

Embodiments of the present invention can advantageously provide a reliable approach for synchronization of a reference clock to a radio signal during baseband frequency recovery. These and other advantages of the present invention will become readily apparent from the detailed description of preferred embodiments below.

BRIEF DESCRIPTION OF THE DRAWINGS

FIG. 1 is a schematic block diagram showing a conventional Costas receiver circuit.

FIG. 2 is a schematic block diagram showing a conventional reference phase-locked loop (PLL).

DETAILED DESCRIPTION OF THE PREFERRED EMBODIMENTS

Figure 3:
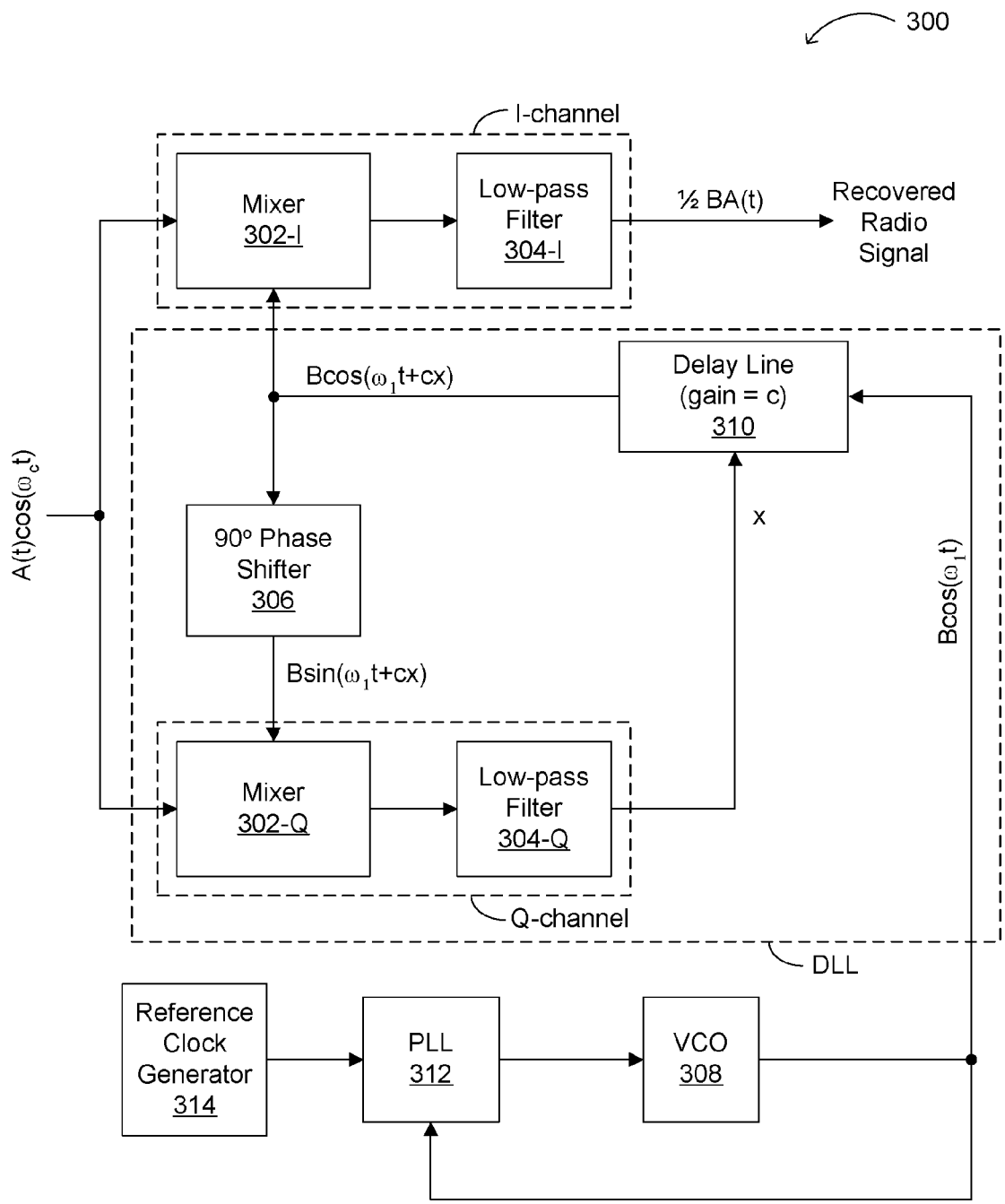
FIG. 3 is an exemplary block schematic diagram showing a delay line receiver in accordance with embodiments of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on code, data bits, data streams or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise and/or as is apparent from the following discussions, it is appreciated that throughout the present application, discussions utilizing terms such as "operating," "calculating," "determining," or the like, refer to the action and processes of a computer or data processing system, or similar processing device (e.g., an electrical, optical, or quantum computing or processing device or circuit), that manipulates and transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display devices, etc.) into other data similarly represented as physical quantities within other components of the same or a different system or architecture.

Furthermore, in the context of this application, the terms "wire," "wiring," "line," and "signal" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Similarly, for convenience and simplicity, the terms "clock," "time," "timing," "rate," "period" and "frequency" are, in general, interchangeable and may be used interchangeably herein, but are generally given their art-recognized meanings. Also, for convenience and simplicity, the terms "data," "data stream," "waveform" and "information" may be used interchangeably, as may the terms "connected to," "coupled with," "coupled to," and "in communication with" (which may refer to direct or indirect connections, couplings, or communications), but these terms are generally given their art-recognized meanings herein.

Embodiments of the present invention advantageously provide a reliable approach for synchronization of a reference clock to an incoming signal during baseband frequency recovery. The invention, in its various aspects, will be explained in greater detail below with regard to exemplary embodiments.

According to various embodiments of the present invention, an architecture or circuit for synchronization of a reference clock to an incoming signal (e.g., a radio signal) during baseband frequency recovery can include the use of a delay element and/or circuit in a delay-locked loop (DLL). A delay adjustment signal from this delay element can be provided to a first channel, while a phase adjustment signal can be provided to a second channel. The second channel can provide a delay control signal for control of the delay element, while the first channel can provide a recovered radio signal using the delay adjustment signal. Further, a reset control circuit can be included to appropriately reset the delay control signal.

For directly converting transmitted data (e.g., a radio signal) into a baseband signal frequency, a modified Costas receiver may be used. In a conventional variation of this type of receiver, a second voltage-controlled oscillator (VCO) may be used, in addition to a VCO in the reference clock generating path for the receiver. However, in accordance with embodiments of the present invention, one of these two VCOs can be replaced with a delay element. In particular, a DLL can be included that may receive a phase-shifted output of the Costas receiver and a reference clock. This approach can allow for improved synchronization of the reference clock to a received radio signal during baseband frequency recovery.

An Exemplary Receiver Circuit

An exemplary receiver circuit according to the present invention can include: (i) a VCO for providing a reference clock; (ii) a delay element that can receive the reference clock and provide a delay adjustment signal; (iii) a first channel for receiving a radio signal and providing a recovered radio signal from the radio signal and the delay adjustment signal, where the first channel includes a first mixer and a first filter; and (iv) a second channel for receiving the radio signal and a phase adjustment signal derived from the delay adjustment signal and for providing a delay control signal to the delay element from the radio signal and the phase adjustment signal, where the second channel includes a second mixer and a second filter.

Referring now to FIG. 3, an exemplary block schematic diagram showing a delay line receiver in accordance with embodiments of the present invention is indicated by the general reference character 300. Here, delay element or delay line 310 may comprise an analog delay line with a bias (e.g., delay control signal x) applied to a chain of bias-controlled inverters, or a digitally-selectable chain of inverters. In the former case, the delay provided by the inverters is dependent on the bias (e.g., so-called "current starved" inverters, where the amount of the delay can be correlated to the value of the bias voltage applied to transistors that provide current to and/or sink current from the inverters). In the latter case, delay line 310 may further comprise an analog-to-digital converter (ADC), and the delay control signal x may be converted to a multi-bit digital signal by the ADC. Also, the delay-locked loop (DLL) including delay line 310, 90° phase shifter 306, mixer 302-Q, and low-pass filter 304-Q can essentially be used in place of a traditional VCO (after a phase discriminator), where the VCO and/or phase discriminator may be found in conventional approaches. Further, delay line 310 can have a gain (c) and receive a delay control signal (x). In any event, the delay control signal can be used to control the delay using adjustable delay elements or other such circuit components within delay line 310, or another suitable delay circuit for providing a controllable delay path.

An input signal (e.g., a radio signal) having a periodic and/or sinusoidal waveform (e.g., having a waveform A(t)cos(o),t)) can be applied to mixers 302-I and 302-Q in an I-channel and a Q-channel, respectively. Multipliers or mixers 302-I and 302-Q may each be clocked with reference signals that are substantially equal in frequency, but having a 90° phase shift between them, using phase shifter 306. For example, a delay adjustment signal (e.g., B cos($\omega_1$t+cx)) may be applied to mixer 302-I and phase shifter 306, while a phase-shifted adjustment signal (the "phase adjustment signal") may be applied to mixer 302-Q. Typically, the phase adjustment signal comprises the delay adjustment signal phase-shifted by 90° (e.g., B sin($\omega_1$t+cx)), but other phase shifts having known and/or predetermined relationships to the delay adjustment signal and/or delay control signal x (discussed below) may also be used. In addition, each mixer output may be passed through a corresponding low-pass filter (e.g., 304-I in the I-channel, and 304-Q in the Q-channel) to remove higher frequency summation terms.

As discussed above, the received radio signal in this particular example can have the general form A(t)cos($\omega_c$t), where A(t) can be any time-varying signal, and may refer to an amplitude of the signal as a function of time, "cos" (or cosine) indicates a sinusoidal and/or periodic waveform, $\omega$ represents an angular frequency, where $\omega=2\pi f$ (where "f" is the frequency of the sinusoidal waveform), and "t" can represent time. Further, B(t) is ideally a square wave, but may comprise any oscillating signal, such as one having a sinusoidal or other regular periodic form.

VCO 308 generally provides a reference clock (e.g., B cos($\omega_1$t)) from a phase-locked loop (PLL) output. For example, a reference clock generator 314 (e.g., an oscillating crystal) may be used to generate an oscillating signal, and that oscillating signal may be provided to PLL 312, which may be coupled to VCO 308. Also, delay line 310 can receive the reference clock and provide a delay adjustment signal (e.g., B cos($\omega_1$t+cx)) and/or phase adjustment signal (e.g., B sin($\omega_1$t+cx), via phase shifter 306.

Generally, the I-channel provides the desired signal (e.g., the recovered radio signal), while the Q-channel provides a correction term or delay control signal x that may be applied to a delay element in, or associated with, delay line 310. Such a delay element may take a particular input frequency and delay an output by a predetermined amount of time relative to the delay line input receiving the particular frequency. In this particular example, the reference clock B cos($\omega_1$t) received at delay line 310 can produce a delay adjustment signal B cos($\omega_1$t+cx), where x is the amount of delay time provided by delay line 310, and c is a gain of delay line 310. Accordingly, an output of multiplier or mixer 302-I may be A(t)cos($\omega_c$t)B cos($\omega_1$t+cx). Also, the sum (or mixed) frequency term provided by mixer 302-I can be removed by the use of low-pass filter 304-I, and when it is, an output of the I-channel can be further simplified, as shown below in Equation 2:

$$\tfrac{1}{2}A(t)B\cos((\omega_1-\omega_c)t+cx) = \tfrac{1}{2}A(t)B\cos(\Delta\omega t+cx) \quad (2)$$

The output of multiplier or mixer 302-Q may thus be represented by the waveform $A(t)\cos(\omega_c t)B\sin(\omega_1 t+cx)$. Also, when its sum frequency term is removed by low-pass filter 304-Q, an output of the Q-channel can simplify further, as shown below in Equation 3:

$$\tfrac{1}{2}A(t)B\sin((\omega_1-\omega_c)t+cx)=\tfrac{1}{2}A(t)B\sin(\Delta\omega t+cx) \quad (3)$$

When sin(Y) is relatively small, it may be assumed that a linear approximation of sin(Y) is about Y. As a result, Equation 3 can be further simplified, as shown below in Equation 4:

$$\tfrac{1}{2}A(t)B\sin(\Delta\omega t+cx)=\tfrac{1}{2}A(t)B(\Delta\omega t+cx) \quad (4)$$

Equation 4 can therefore represent an output of the Q-channel, which may be designated as delay control signal x. Consequently, Equation 4 can then be solved for x, as shown below in Equation 5:

$$x=\Delta\omega t/((2/(A(t)*B))-c) \quad (5)$$

Further, in certain configurations, the gain c of delay line 310 may be much greater than 2/A(t)B, such that Equation 5 may be further simplified, as shown below in Equation 6:

$$x=-\Delta\omega t/c, \text{ or } cx=-\Delta\omega t \quad (6)$$

The result from Equation 6 above (which can provide a useful approximation of the time delay provided by delay line 310) can be placed into Equations 2 and 3 above, such that the recovered radio signal at the I-channel output can be simplified to ½A(t)B cos(0)=½BA(t), while the delay control signal at the Q-channel output can be simplified to ½A(t)B sin(0)=0. Accordingly, as long as c>>2/A(t)B, the linear approximation above to sin(Y) can be considered valid, and the desired output, corresponding to a delay control signal value of 0, may be achieved.

An Exemplary Reset Circuit for a Delay-Locked Loop (DLL)

An exemplary delay reset circuit for a DLL can include: (i) a channel configured to receive a radio signal and provide a delay control signal from the radio signal and a phase adjustment signal, where the channel includes a mixer and a filter, and where the DLL includes a delay adjustment signal and the phase adjustment signal, each derived from a reference clock; and (ii) a reset circuit configured to reset the delay control signal at a predetermined time.

As seen above in Equation 6, a control input or delay control signal x provided to a delay element within delay line 310 may be negatively proportional to a time-based delta (e.g., cx=−Δωt). Thus, after a relatively long period of time, delay control signal x, and thus a control voltage or a DC offset of the delay element 310, can also become increasingly large in magnitude. To address systems and/or applications in which the power supply and/or available supply voltage may be limited, the delay control signal can be reset in accordance with embodiments of the present invention by: (i) utilizing similar or identical parallel circuits (e.g., replica delay lines) receiving a common input signal (e.g., the reference clock signal) and the repeatability or periodic nature of a sinusoidal waveform (e.g., the cosine function); and/or (ii) periodically resetting the delay control signal. Further, an "auto-reset" functionality can be employed for such delay control signal resetting operations.

Figure 4A:
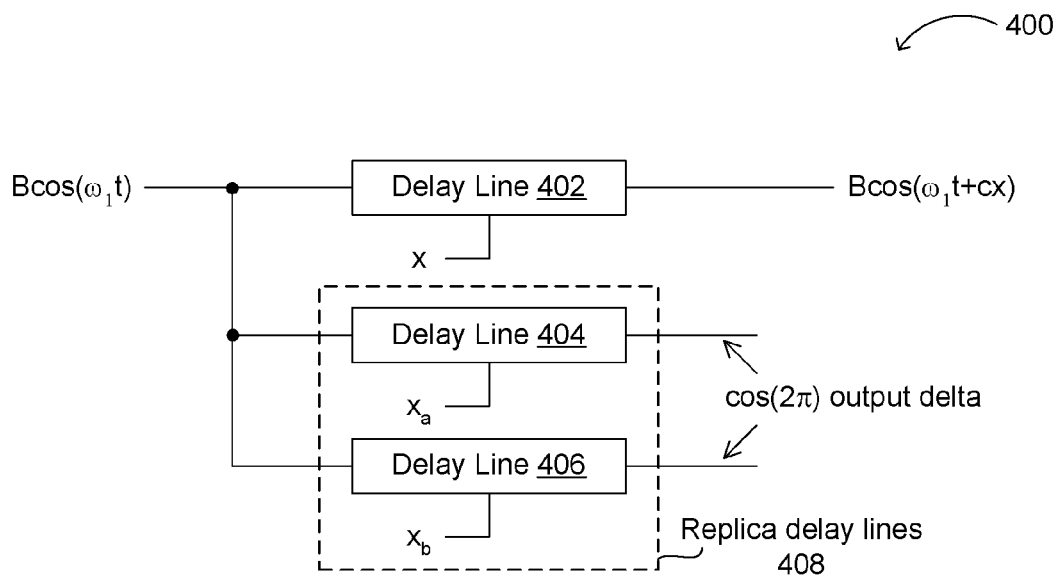
FIG. 4 is an exemplary schematic block diagram showing a reset circuit for delay-locked loop (DLL) having replica circuit portions utilizing cosine function repeatability in accordance with embodiments of the present invention.
Figure 4B:
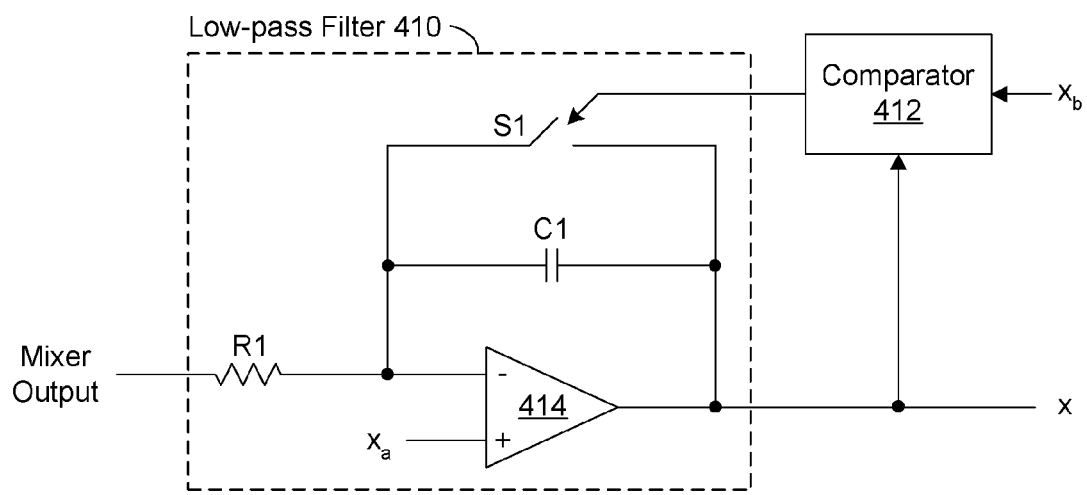

Referring now to FIGS. 4A-4B, an exemplary schematic block diagram showing a DLL reset circuit having replica circuit portions and utilizing sine/cosine function repeatability in accordance with embodiments of the present invention is indicated by the general reference character 400. In utilizing replica circuits (e.g., replica delay lines 408) and the repeatability of the sine and/or cosine function(s) every $2\pi$ radians or 360°, when monitoring the outputs of the replica delay lines (e.g., 404 and 406), which correspond to certain values of the delay adjustment signal (e.g., B cos($\omega_1$t+cx) from delay line 402), the control voltage or delay control signal x can be reset such that an effective $2\pi$ phase shift occurs.

In particular embodiments, replica circuit portions, such as delay lines 404 and 406, can be used in detecting the $2\pi$ threshold. Such delay line circuitry in FIG. 4A can correspond to delay line 310 of FIG. 3. In the particular example of FIGS. 4A-4B, the outputs of replica delay lines 408 can be monitored until the output of delay line 404 (controlled by $x_a$) equals cos(0) and the output of delay line 406 (controlled by $x_b$) equals cos($2\pi$). Thus, $x_a$ and $x_b$ may have fixed or predetermined values such that $x_a$ is substantially equal to a predetermined minimum value for x, and $x_b$ is substantially equal to a predetermined maximum value for x. Referring now to FIG. 4B, comparator circuit 412 can then be used to detect when delay control signal x gets as large as $x_b$, so that a pulse can be provided to close switch S1 in low-pass filter 410 (which may correspond to filter 304-Q in FIG. 3, and which may comprise an analog integrator) formed by resistor R1, capacitor C1, and operational amplifier 414. When S1 is closed, operational amplifier 414 can produce a unity gain feedback for input $x_a$ such that delay control signal x can be reset to the value of input $x_a$. Of course, the $x_a$ and $x_b$ inputs may be switched in the scheme of FIG. 4B for a negative-ramping x. Alternatively, a third fixed/predetermined value $x_c$ may be provided to a second comparator (that also receives x), and the outputs of the two comparators can be logically OR'ed to provide the control signal for closing switch S1.

Referring back to FIG. 3, the delay control signal x may be periodically reset once per fixed interval or predetermined length of time, instead of each $2\pi$ shift corresponding to the cosine function. In particular embodiments, when a reset rate is much higher than the data rate (e.g., 10, 20, 40 or more times higher), then a low-pass filter (e.g., 304-Q) receiving a mixer output (e.g., 302-Q) can also filter out any noise or "non-idealities" resulting from a reset operation. In this particular example, the mixer output can be provided to an analog integrator or low-pass filter that includes a reset switch, as will be discussed in more detail below with regard to FIG. 5. The reset switch can then be periodically pulsed to reset the low-pass filter. Further, the reset pulse duration may be sufficiently long to substantially discharge a capacitor in the low-pass filter. Accordingly, a relatively small capacitor value and a relatively low resistance reset switch can allow for a relatively short reset pulse duration. Alternatively, if the reset pulse width becomes sufficiently wide so as to be significant as compared to the baseband frequency, then data may become corrupted if effects from this reset pulse are not filtered out by the low-pass filter.

Figure 5:
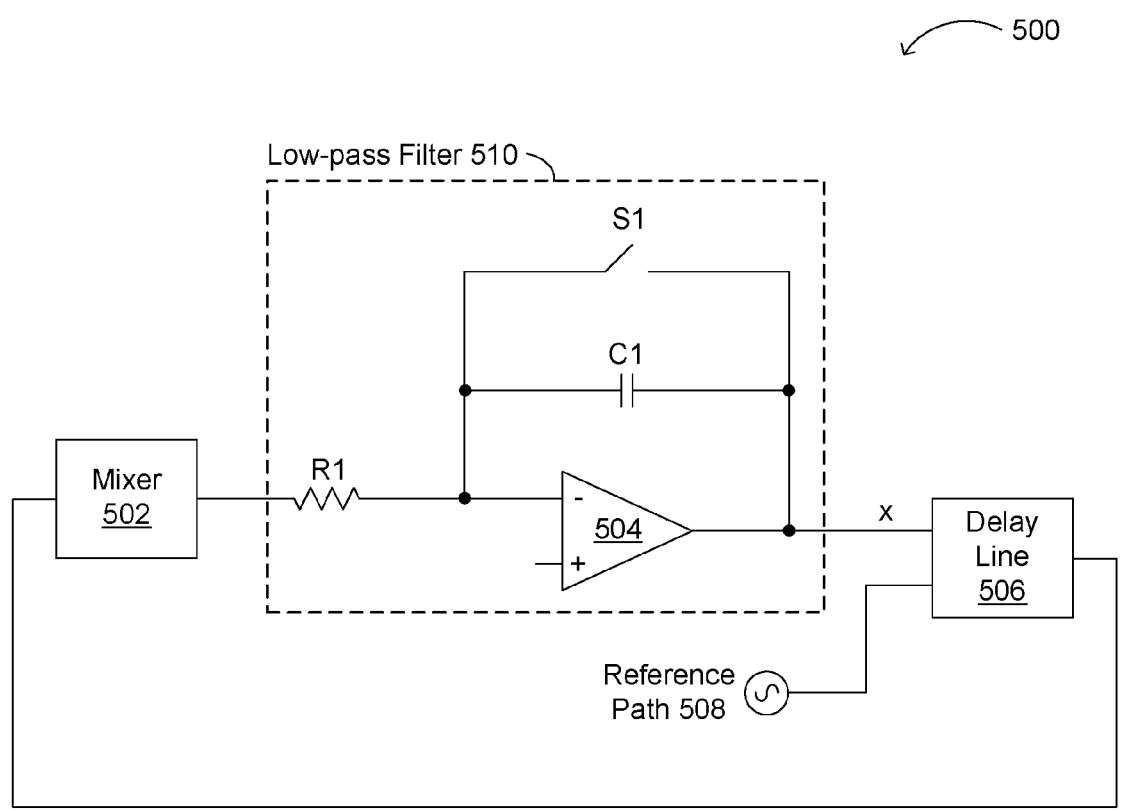
FIG. 5 is an exemplary schematic block diagram showing a resettable DLL in accordance with embodiments of the present invention.

Referring now to FIG. 5, an exemplary schematic block diagram showing a DLL with a reset function in accordance with embodiments of the present invention is indicated by the general reference character 500. Mixer 502 (which may correspond to mixer 302-Q in FIG. 3) can provide an output to low-pass filter 510 (which may correspond to filter 304-Q in FIG. 3, and which may comprise an analog integrator) formed by resistor R1, capacitor C1, and operational amplifier 504 (which receives both the RC-filtered output of mixer 502 and a reference voltage). Further, switch S1 for resetting the low-pass filter by discharging capacitor C1 can be provided as shown. Preferably, during a reset operation, switch S1 is closed (e.g., in response to an active reset signal) for a length of time sufficient to discharge substantially all of the charge on capacitor C1. Also, a delay control signal output (x) from low-pass filter 510 is input into delay line 506 (which may correspond to delay line 310 in FIG. 3), which also receives a reference clock via reference path 508. For example, reference path 508 can include reference clock generator 314, PLL 312, and VCO 308 in the arrangement as shown in FIG. 3. Of course, other reference clock arrangements and/or generation circuits can also be used in accordance with embodiments of the present invention.

An Exemplary Method of Recovering a Modulated Radio Signal

An exemplary method of recovering a modulated radio signal, can include the steps of: (i) generating a delay adjustment signal by delaying a reference clock by a configurable delay; (ii) phase-shifting the delay adjustment signal to provide a phase adjustment signal; (iii) generating a delay control signal from a received radio signal and the phase adjustment signal; and (iv) recovering the modulated radio signal from the received radio signal and the delay adjustment signal.

Figure 6:
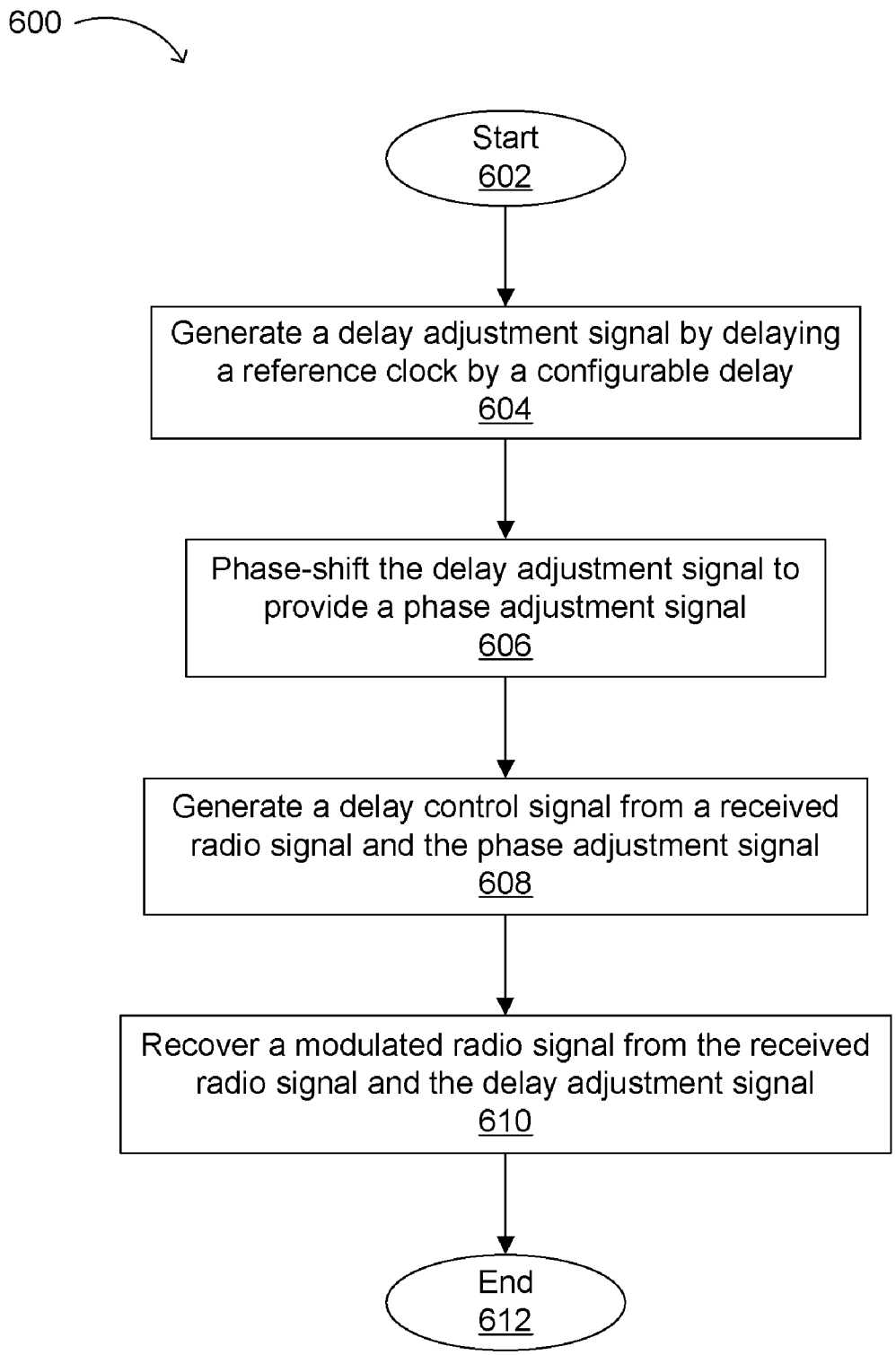
FIG. 6 is a flow diagram showing an exemplary method of recovering a modulated radio signal in accordance with embodiments of the present invention.

Referring now to FIG. 6, a flow diagram showing an exemplary method of recovering a modulated radio signal in accordance with embodiments of the present invention is shown and indicated by the general reference character 600. The flow can begin (602), and a delay adjustment signal can be generated by delaying (e.g., via a delay line) a reference clock using a configurable delay (604). The delay adjustment signal can be phase-shifted (e.g., by about 90°) to provide a phase adjustment signal (606). The phase shift may be by another amount providing a known and/or predictable relationship between the delay adjustment signal and the delay provided by the delay element (e.g., delay line 310 in FIG. 3). Referring back to FIG. 6, a delay control signal can be generated from a received radio signal and the phase adjustment signal (608). The modulated radio signal can then be recovered from the received radio signal using the delay adjustment signal (610), and the flow can complete (612). The method may be modified and/or supplemented in accordance with the operation(s) of the radio receiver 300 described above with regard to FIG. 3, the reset circuits described above with regard to FIGS. 4 and 5, and/or the method described below with regard to FIG. 7.

Exemplary Method of Synchronizing a Reference Clock to a Radio Signal During Baseband Frequency Recovery An exemplary method of synchronizing a reference clock to a radio signal can include the steps of: (i) receiving the radio signal in first and second channels, the first channel providing a recovered radio signal using a delay adjustment signal, and the second channel providing a delay control signal using a phase adjustment signal derived from the delay adjustment signal; (ii) controlling a delay element using the delay control signal, the delay element receiving a reference clock and providing the delay adjustment signal; and (iii) resetting the delay control signal at a predetermined time. Resetting can occur at a fixed interval (e.g., periodically), or at a length of time corresponding to the delay adjustment signal having $\cos(0)$ or $\cos(2\pi)$ values, for example.

Figure 7:
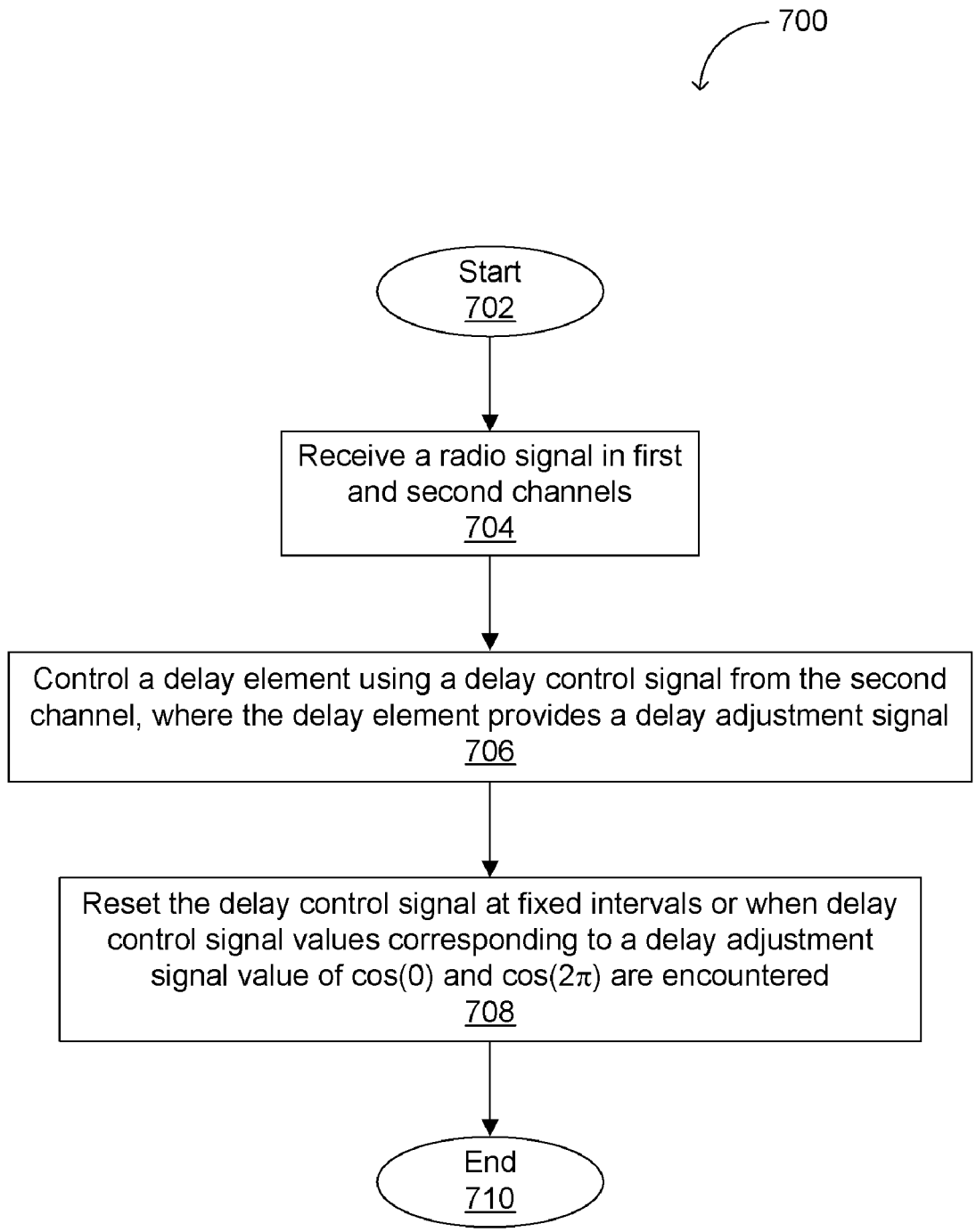
FIG. 7 is a flow diagram showing an exemplary method of synchronizing a reference clock to a radio signal during baseband frequency recovery in accordance with embodiments of the present invention.

Referring now to FIG. 7, a flow diagram showing an exemplary method of synchronizing a reference clock to a radio signal in accordance with embodiments of the present invention is indicated by the general reference character 700. The flow can begin (702) and a radio signal can be received in first and second channels (704). For example, the radio signal can be received in an I-channel and a Q-channel, where each channel includes a mixer and a low-pass filter, as shown in FIG. 3.

Next in FIG. 7, a delay element (e.g., in a DLL) can be controlled using a delay control signal from the second channel (706). In the example of FIG. 3, such a delay control signal can be provided by the Q-channel. Next, the delay control signal can be reset at a predetermined time (708), and the flow can complete (710). As discussed above, (i) replica circuits for taking advantage of the repeatability of a sinusoidal waveform such as the cosine function (e.g., at $\cos(0)$ and $\cos(2\pi)$) can be utilized; and/or (ii) the delay control signal may be periodically reset, for example using the reset switch of FIG. 5. For an example of the replica circuit approach, see FIG. 4, and for an example of the fixed interval (e.g., periodic) approach, see FIG. 5.

While the above examples include particular implementations of radio receiver and DLL control and reset circuitry, as well as particular forms of time-varying signals, one skilled in the art will recognize that other technologies and/or signal types or forms may also be used in accordance with embodiments. Further, one skilled in the art will recognize that current-based differential signaling and/or control may also be used in accordance with embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A receiver circuit, comprising:
   a) a voltage-controlled oscillator (VCO) configured to provide a reference clock;
   b) a delay element configured to receive said reference clock and provide a delay adjustment signal;
   c) a first channel configured to receive a radio signal and provide a recovered radio signal from said radio signal and said delay adjustment signal, said first channel comprising a first mixer and a first filter; and
   d) a second channel configured to receive said radio signal and a phase adjustment signal derived from said delay adjustment signal, and provide a delay control signal to said delay element from said radio signal and said phase adjustment signal, said second channel comprising a second mixer and a second filter.

2. The receiver circuit of claim 1, further comprising a phase-locked loop (PLL) coupled to a DLL and said VCO, said PLL being configured to provide said reference clock, wherein said DLL comprises said delay element and said second channel.

3. The receiver circuit of claim 1, comprising a phase shifter configured to receive said delay adjustment signal and provide said phase adjustment signal.

4. The receiver circuit of claim 3, wherein when said radio signal has a form $A(t)\cos(\omega_c t)$, said recovered radio signal comprises a form $\frac{1}{2}BA(t)$, and said reference clock has a form $B\cos(\omega_1 t)$.

5. The receiver circuit of claim 1, wherein each of said first and second filters comprises a low-pass filter.

6. The receiver circuit of claim 1, wherein said phase adjustment signal differs in phase from said delay adjustment signal by about 90°.

7. The receiver circuit of claim 1, further comprising a reset circuit configured to reset said delay control signal at a predetermined time.

8. The receiver circuit of claim 7, wherein said predetermined time comprises when said delay control signal corresponds to a delay adjustment signal having a cos(0) or a cos(2π) value.

9. The receiver circuit of claim 7, wherein said predetermined time comprises a fixed interval.

10. The receiver circuit of claim 7, wherein said reset circuit comprises replica delay line circuitry and a comparator 11. The receiver circuit of claim 7, wherein said reset circuit comprises a reset switch coupled to a low-pass filter.

12. The receiver circuit of claim 1, wherein said delay control signal is derived from only said radio signal and said phase adjustment signal.

13. The receiver circuit of claim 1, wherein said delay control signal is coupled directly to said delay element.

14. A method of recovering a modulated radio signal, comprising the steps of:
   a) generating a delay adjustment signal by delaying a reference clock by a configurable delay;
   b) phase-shifting said delay adjustment signal to provide a phase adjustment signal;
   c) generating a delay control signal from a received radio signal and said phase adjustment signal; and
   d) recovering said modulated radio signal from said received radio signal and said delay adjustment signal.

15. The method of claim 14, wherein the step of generating said delay adjustment signal comprises using a delay element in a delay-locked loop (DLL).

16. The method of claim 14, wherein when said received radio signal has a form $A(t)\cos(\omega_c t)$, said modulated radio signal comprises a form $\frac{1}{2}BA(t)$, and said reference clock has a form $B\cos(\omega_1 t)$.

17. The method of claim 14, wherein the step of phase-shifting said delay adjustment signal comprises phase-shifting by about 90°.

18. The method of claim 14, further comprising resetting said delay control signal.

19. The method of claim 14, wherein said delay control signal is generated from only said received radio signal and said phase adjustment signal.

20. A method of synchronizing a reference clock to a radio signal, comprising the steps of:
   a) receiving said radio signal in first and second channels, said first channel providing a recovered radio signal using a delay adjustment signal, and said second channel providing a delay control signal using a phase adjustment signal derived from said delay adjustment signal;
   b) controlling a delay element using said delay control signal, said delay element receiving a reference clock and providing said delay adjustment signal; and
   c) resetting said delay control signal at a predetermined time.

21. The method of claim 20, wherein each of said first and second channels comprises a mixer and a low-pass-filter.

22. The method of claim 20, wherein said predetermined time comprises when said delay control signal corresponds to a delay adjustment signal having a cos(0) or a cos(2π) value.

23. The method of claim 22, wherein the step of resetting comprises comparing a channel circuit output to a predetermined maximum value corresponding to said cos(2π) value, and setting said channel circuit output to a predetermined minimum value corresponding to said cos(0) value.

24. The method of claim 20, wherein said predetermined time comprises a fixed interval.

25. The method of claim 20, wherein said delay control signal is derived from only said radio signal and said phase adjustment signal.

26. The method of claim 20, wherein said delay control signal is coupled directly to said delay element.

27. A circuit for resetting a delay in a delay-locked loop (DLL), comprising:
   a channel configured to receive a radio signal and provide a delay control signal from said radio signal and a phase adjustment signal, said channel comprising a mixer and a filter, wherein said phase adjustment signal is derived from a delay adjustment signal, and wherein said DLL comprises a delay element configured to provide said delay adjustment signal from a reference clock; and
   a reset circuit configured to reset said delay control signal at a predetermined time;
   wherein said reset circuit comprises:
   a) first and second replica delay lines; and
   b) a comparator coupled to an output of said filter and an output of said second replica delay line, wherein said comparator is configured to generate a pulse for resetting a switch to reset said delay control signal to a value of a delay control for said first replica delay line, said pulse being generated when an output of said first replica delay line has a cos(0) value, and an output of said second replica delay line has a cos(2π) value.

28. A circuit for resetting a delay in a delay-locked loop (DLL), comprising:
   a) a channel configured to receive a radio signal and provide a delay control signal from said radio signal and a phase adjustment signal, said channel comprising a mixer and a filter, wherein said phase adjustment signal is derived from a delay adjustment signal, and wherein said DLL comprises a delay element configured to provide said delay adjustment signal from a reference clock; and
   b) a reset circuit configured to reset said delay control signal at a predetermined time;
   wherein said reset circuit comprises a switch coupled to said filter, said switch being configured to reset said filter at said predetermined time.

29. The circuit of claim 28, wherein said switch is configured to substantially discharge a capacitor in said filter when said switch is closed.

* * * * *